(12) United States Patent
Golovchenko et al.

(10) Patent No.: US 7,466,069 B2
(45) Date of Patent: Dec. 16, 2008

(54) CARBON NANOTUBE DEVICE FABRICATION

(75) Inventors: Jene A. Golovchenko, Lexington, MA (US); Haibing Peng, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 10/696,462

(22) Filed: Oct. 29, 2003

(65) Prior Publication Data

US 2005/0007002 A1   Jan. 13, 2005

Related U.S. Application Data

(60) Provisional application No. 60/422,041, filed on Oct. 29, 2002.

(51) Int. Cl.
*H01J 1/88* (2006.01)
*H01J 1/02* (2006.01)
*C23C 16/00* (2006.01)

(52) U.S. Cl. ............ 313/257; 257/E51.04; 427/249.1; 313/238; 313/311

(58) Field of Classification Search .......... 313/311, 313/257, 238; 257/E51.04; 427/249.1
See application file for complete search history.

(56) References Cited

U.S. PATENT DOCUMENTS

| | | | |
|---|---|---|---|
| 6,297,063 B1 * | 10/2001 | Brown et al. ................. 438/2 |
| 6,333,016 B1 | 12/2001 | Resasco et al. | |
| 6,346,189 B1 | 2/2002 | Dai et al. | |
| 6,350,488 B1 | 2/2002 | Lee et al. | |
| 6,361,861 B2 | 3/2002 | Gao et al. | |
| 6,515,339 B2 * | 2/2003 | Shin et al. ................. 257/368 |
| 6,528,020 B1 | 3/2003 | Dai et al. | |
| 6,555,362 B2 | 4/2003 | Hidaka et al. | |
| 6,566,704 B2 | 5/2003 | Choi et al. | |
| 6,566,983 B2 | 5/2003 | Shin | |
| 6,605,894 B2 | 8/2003 | Choi et al. | |
| 6,689,674 B2 | 2/2004 | Zhang et al. | |
| 6,706,402 B2 | 3/2004 | Rueckes et al. | |
| 6,706,566 B2 | 3/2004 | Avouris et al. | |
| 6,891,227 B2 | 5/2005 | Appenzeller et al. | |
| 6,919,592 B2 | 7/2005 | Segal et al. | |
| 6,942,921 B2 | 9/2005 | Rueckes et al. | |
| 7,120,047 B2 | 10/2006 | Segal et al. | |

(Continued)

FOREIGN PATENT DOCUMENTS

DE   102 50 829 A1   10/2002

(Continued)

OTHER PUBLICATIONS

Kong et al., "Synthesis of individual single-walled carbon nanotubes on patterned silicon wafers," Nature, vol. 395, pp. 878-881, Oct. 29, 1998.

(Continued)

*Primary Examiner*—Karabi Guharay
(74) *Attorney, Agent, or Firm*—Theresa A. Lober (57) ABSTRACT

A carbon nanotube device in accordance with the invention includes a support structure including an aperture extending from a front surface to a back surface of the structure. At least one carbon nanotube extends across the aperture and is accessible through the aperture from both the front surface and the back surface of the support structure.

23 Claims, 5 Drawing Sheets

U.S. PATENT DOCUMENTS

| | | | |
|---|---|---|---|
| 2001/0009693 | A1 | 7/2001 | Lee et al. |
| 2002/0014667 | A1 | 2/2002 | Shin et al. |
| 2002/0046872 | A1 | 4/2002 | Smalley et al. |
| 2002/0167374 | A1* | 11/2002 | Hunt et al. ............... 333/186 |
| 2002/0172767 | A1 | 11/2002 | Grigorian et al. |
| 2003/0157333 | A1 | 8/2003 | Ren et al. |
| 2003/0186167 | A1 | 10/2003 | Johnson, Jr. et al. |
| 2003/0214054 | A1 | 11/2003 | Awano et al. |
| 2004/0043527 | A1* | 3/2004 | Bradley et al. ............... 438/48 |
| 2004/0132070 | A1 | 7/2004 | Star et al. |
| 2004/0144972 | A1 | 7/2004 | Dai et al. |
| 2004/0200734 | A1 | 10/2004 | Co et al. |
| 2005/0224778 | A1 | 10/2005 | Dubin et al. |
| 2006/0006377 | A1 | 1/2006 | Golovchenko et al. |
| 2006/0065887 | A1 | 3/2006 | Tiano et al. |
| 2006/0158760 | A1 | 7/2006 | Portico Ambrosio et al. |
| 2007/0012980 | A1 | 1/2007 | Duan et al. |

FOREIGN PATENT DOCUMENTS

| | | |
|---|---|---|
| WO | WO 01/44796 A1 | 6/2001 |
| WO | WO 02/26624 A1 | 4/2002 |
| WO | WO 02/054505 A2 | 7/2002 |
| WO | WO 02/092505 A2 | 11/2002 |
| WO | WO 2004/040616 A2 | 5/2004 |

OTHER PUBLICATIONS

Fan et al., "Self-Oriented Regular Arrays of Carbon Nanotubes and Their Field Emission Properties," Science, vol. 283, pp. 512-514, Jan. 22, 1999.

Martel et al., "Single- and multi-wall carbon nanotube field-effect transistors," Appl. Phys. Lett., vol. 73, No. 17, pp. 2447-2449, Oct. 26, 1998.

Ren et al., "Growth of a single freestanding multiwall carbon nanotube on each nanonickel dot," Appl. Phys. Letts., vol. 75, No. 8, pp. 1086-1088, Aug. 23, 1999.

Cassell et al., "Directed Growth of Free-Standing Single-Walled Carbon Nanotubes," J. Am. Chem. Soc., vol. 121, pp. 7975-7976, 1999.

Seeger et al., "SiOx-coating of carbon nanotubes at room temperature," Chem. Phys. Lett., vol. 339, pp. 41-46, May 4, 2001.

Zhang et al., "Electric-field-directed growth of aligned single-walled carbon nanotubes," Appl. Phys. Lett., vol. 79, No. 19, pp. 3155-3157, Nov. 5, 2001.

Wind et al., "Vertical scaling of carbon nanotube field-effect transistors using top gate electrodes," Appl. Phys. Lett., vol. 80, No. 20, pp. 3817-3819, May 20, 2002.

Franklin et al., "Integration of suspended carbon nanotube arrarys into electronic devices and electromechanical systems," Appl. Phys. Lett., vol. 81, No. 5, pp. 913-915, Jul. 29, 2002.

Homma et al., "Growth of suspended carbon nanotube networks on 100-nm-scale silicon pillars," Appl. Phys. Lett., vol. 81, No. 12, pp. 2261-2263, Sep. 16, 2002.

Ural et al., "Electric-field-aligned growth of single-walled carbon nanotubes," Appl. Phys. Lett., vol. 81, No. 18, pp. 3464-3466, Oct. 28, 2002.

Campbell et al., "Simple catalyst for the growth of small-diameter carbon nanotubes," Appl. Phys. Lett., vol. 81, No. 24, pp. 4586-4588, Dec. 9, 2002.

Javey et al., "High-k dielectrics for advanced carbon-nanotube transistors and logic gates," Nature Materials, vol. 1, pp. 241-246, Dec. 2002.

Whitsitt et al., "Silica Coated Single Walled Carbon Nanotubes," Nano Letters, vol. 3, No. 6, pp. 775-778, 2003.

Zambov et al., "Template-Directed CVD of Dielectric Nanotubes," Chem. Vap. Deposition, vol. 9, No. 1, pp. 26-33, 2003.

Marty et al., "Self-assembled single wall carbon nanotube field effect transistors," IEEE Nano, vol. 2, pp. 240-243, 2003.

Han et al., "Coating Single-Walled Carbon Nanotubes with Tin Oxide," Nano Letters, vol. 3, No. 5, pp. 681-683, 2003.

Chung et al., "Nanoscale gap fabrication and integration of carbon nanotubes by micromachining," Sensors and Actuators A, vol. 104, pp. 229-235, 2003.

Peng et al., "Patterned growth of single-walled carbon nanotube arrays from a vapor-deposited Fe catalyst," Appl. Phys. Lett., vol. 83, No. 20, pp. 4238-4240, Nov. 17, 2003.

Chin et al., "Optical limiting properties of amorphous SixNy and SiC coated carbon nanotubes," Chem. Phys. Lett., vol. 383, pp. 72-75, 2004.

Radosavljevic et al., "High performance of potassium n-doped carbon nanotube field-effect transistors," Appl. Phys. Lett., vol. 84, No. 18, pp. 3693-3695, May 3, 2004.

Graham et al., "Towards the integration of carbon nanotubes in microelectronics," Diamond and Related Materials, vol. 13, pp. 1296-1300, 2004.

Peng et al., "Coulomb blockade in suspended Si3N4-coated single-walled carbon nanotubes," Appl. Phys. Lett., vol. 84, No. 26, pp. 5428-5430, Jun. 28, 2004

* cited by examiner

CARBON NANOTUBE DEVICE FABRICATION

This application claims the benefit of U.S. Provisional Application No. 60/422,041, filed Oct. 29, 2002, the entirety of which is hereby incorporated by reference.

STATEMENT REGARDING FEDERALLY SPONSORED RESEARCH

This invention was made with Government support under Contract No. F49620-01-1-0467, awarded by DARPA, and under Contract No. DMR-0073590, awarded by the NSF. The Government has certain rights in the invention.

BACKGROUND OF INVENTION

This invention relates generally to the synthesis of carbon nanotubes, and more particularly relates to techniques for controllably fabricating and testing single-walled carbon nanotubes.

Since their discovery, carbon nanotubes have attracted intense research into their electrical and mechanical properties and have been proposed for implementation in a wide range of electronics as well as mechanical and electromechanical applications. In particular it has been demonstrated that carbon nanotubes are distinctly well-suited for applications including, e.g., microelectronic and nanoelectronic devices and systems, chemical sensors, transducers, displays, physical probes, and energy storage devices.

Synthesis of carbon nanotubes has been achieved by various techniques, including, e.g., methods of arc-discharge, laser ablation, and thermal decomposition of a hydrocarbon. There has been demonstrated with such methods the ability to produce a range of nanotube characteristics. For example, there can be produced films, or mats, of randomly oriented nanotubes or alternatively, arrays of nanotubes that are aligned in a selected orientation. There has also been demonstrated the ability to selectively produce single-walled nanotubes (SWNTs) or multi-walled nanotubes (MWNTs) as-desired for a given application.

As the applications for carbon nanotubes present more particular requirements, additional precision in the control of nanotube synthesis is critical. Specifically, precise and repeatable control of nanotube location, orientation, diameter, and single- or multi-wall configuration are required to successfully address many important applications. Without such control, nanotubes cannot meet the commercial manufacturing requirements of applications for which nanotubes are so well suited.

SUMMARY OF THE INVENTION

The invention provides a method for fabricating nanotubes in a precise and repeatable manner, resulting in nanotube device configurations that accommodate in situ test and analysis and that are amenable to a wide range of applications. A carbon nanotube device in accordance with the invention includes a support structure including an aperture extending from a front surface to a back surface of the structure. At least one carbon nanotube extends across the aperture and is accessible through the aperture from both the front surface and the back surface of the support structure. With this arrangement, the nanotube can be employed in a wide range of applications for which there is required exposure of the nanotube to an environment of interest. For example, a gas or liquid of interest can be directed through the support structure aperture to enable sensing or other function by the nanotube as the gas or liquid passes around the nanotube. Also, these configurations can be used directly in nano-electromechanical applications, such as high frequency resonators.

The carbon nanotube provided in the carbon nanotube device of the invention can be a single-walled carbon nanotube, a multi-walled nanotube, and either a semiconducting or metallic nanotube, and can be provided as a plurality of nanotubes. The support structure can be provided as a substrate, e.g., a semiconducting substrate, a membrane, e.g., a nitride or oxide membrane, or other suitable structure. Whatever support structure is provided, it can be aligned between a source of electrons and an electron detector for transmission electron microscopy of the carbon nanotube. For many applications, it can be preferred to provide at least one pair of electrically conducting contact pads disposed on the support structure separated by the aperture. Each end of a carbon nanotube can be located at such a contact pad, preferably disposed on top of a contact pad. A plurality of pairs of contact pads can be disposed at locations around the aperture.

In accordance with the invention, a carbon nanotube device can be fabricated by providing a support structure and forming at least one carbon nanotube catalyst region on a surface of the support structure. An aperture is formed from a front surface to a back surface of the support structure adjacent to the catalyst region. The catalyst region is then exposed to a hydrocarbon gas, synthesizing across the aperture a carbon nanotube that is accessible from both the front surface and the back surface of the support structure.

The carbon nanotube catalyst region can be formed by vapor depositing, e.g., by thermal evaporation, a catalyst material, such as Fe, and lithographically patterning the deposited catalyst material to define the catalyst region. The catalyst region can be formed to substantially abut the aperture. A catalyst region of less than about 2 nm in thickness can be preferred for enabling selective synthesis of single-walled nanotubes, and pairs of catalyst regions can be formed if desired.

An electrically conducting contact pad can be provided under the carbon nanotube catalyst region on the support structure surface. Such a contact pad can be formed by, e.g., depositing a layer of metal and etching the metal layer to form a contact pad prior to forming a catalyst region on the contact pad.

The hydrocarbon gas to which the catalyst region is exposed can be substantially only methane, supplied at a flow rate of, e.g., less than about 400 sccm. The methane exposure can be carried out at a temperature of, e.g., less than about 1500° C. During methane exposure, an electric field can be applied across the aperture in a direction corresponding to a desired nanotube synthesis direction.

Other features and advantages of the invention will be apparent from the following description and accompanying drawings, and from the claims.

DETAILED DESCRIPTION OF THE INVENTION

Figure 1A:
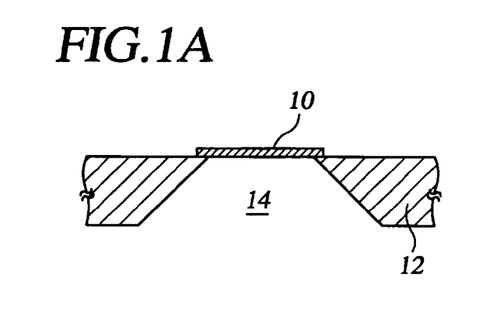
FIGS. 1A-1B are schematic cross-sectional and planar views, respectively, of a carbon nanotube provided in accordance with the invention suspended over an aperture in a substrate.
Figure 1B:
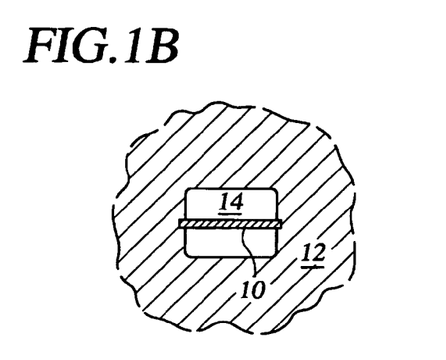

The invention provides nanotube device configurations and corresponding growth process sequences that enable repeatable and reliable production of nanotubes, and single-wall nanotubes in particular, in the selected configurations. Referring to FIG. 1A, in a first nanotube device in accordance with the invention, there is provided a nanotube 10 the ends of which contact a support structure such as a substrate 12 having an aperture 14 across which the single-walled nanotube extends. As shown in the planar top-down view of FIG. 1B, because the aperture 14 extends completely through the substrate 12 the nanotube forms a bridge across the aperture and can be accessed from either face of the substrate. Although the substrate aperture 14 is shown in this example as being square, such is not specifically required; the aperture can be provided as any convenient shape, e.g., circular, rectangular, or other suitable shape.

Figure 2A:
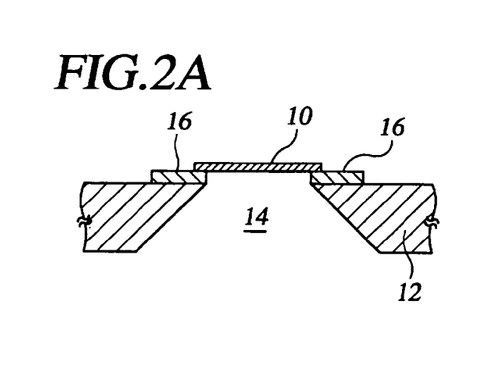
FIGS. 2A-2B are schematic cross-sectional and planar views, respectively, of a carbon nanotube provided in accordance with the invention suspended over an aperture in a substrate and connecting two electrically conducting contact pads.
Figure 2B:
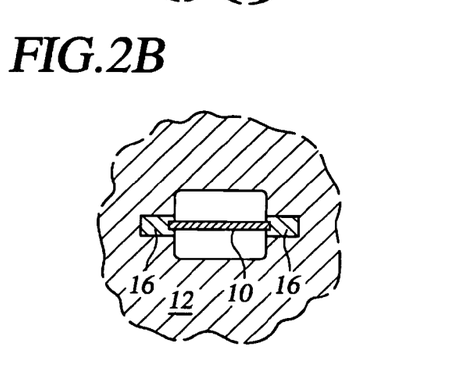

Referring now to FIGS. 2A-2B, this suspended nanotube configuration can be employed in accordance with the invention to make electrical contact between two electrodes or electrically conducting regions on the substrate. For example, as shown in FIG. 2A, there can be provided electrical contact pads 16 atop a substrate 12 having an aperture 14 across which a nanotube extends. As shown in FIG. 2B, the nanotube 10 makes a bridging contact between the two electrodes across the aperture in the substrate 12. The nanotube is synthesized, by the process described below, to be located on top of the contact pads. Although in this example configuration there are shown contact pads 16 at opposite ends of the aperture 12 such is not specifically required; contact pads can be provided at other locations around the periphery of the aperture and can be provided as groups of three or more electrodes as suitable for a given application.

As these examples illustrate, the invention provides the ability to produce selected arrangements of nanotubes on a substrate in various nanotube device configurations. A common feature of all arrangements provided by the invention is an aperture or other configuration in a support substrate which enables access to the nanotube from both sides of the substrate. The nanotube thereby forms a bridge across the substrate aperture. With this arrangement, the nanotube can be employed in a wide range of applications for which there is required exposure of the nanotube to an environment of interest. For example, a gas or liquid of interest can be directed through the substrate aperture to enable sensing or other function by the nanotube as the gas or liquid passes around the nanotube. Also, these configurations can be used directly in nano-electromechanical applications, such as high frequency resonators.

In addition, the suspended nanotube arrangement provided by the invention enables in situ examination and test of a synthesized nanotube in a particularly convenient manner. It is now common practice to examine synthesized nanotubes by transmission electron microscopy (TEM) to determine the nanotube diameter, wall thickness, and single- or multi-wall configuration of the nanotube. In general, TEM requires the ability to configure a nanotube under investigation between an electron beam source and a detector. With the arrangement of the invention, a synthesized nanotube as-grown on a substrate can be examined in situ, without the need for destructive nanotube removal or physical interference.

Figure 3:
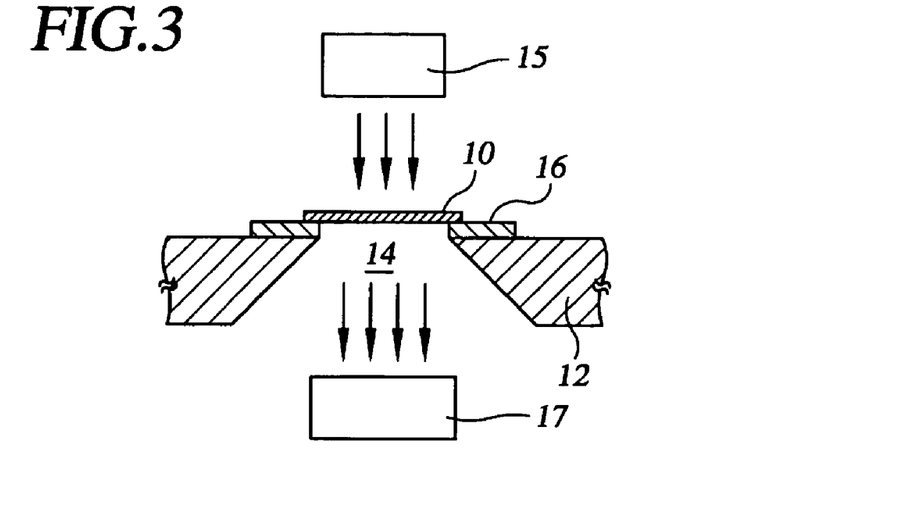
FIG. 3 is a schematic cross-sectional view of the nanotube configuration of FIGS. 2A-2B, here employed in TEM analysis of the nanotube.

Referring to FIG. 3, in accordance with the invention, a substrate 12 having a nanotube suspended across an aperture 14 in the substrate can be positioned between an electron beam source 15 and a detector 17, i.e., with the aperture 14 in the electron beam path to the detector 17. Trajectory of the electron beam through the nanotube 10 and through the substrate aperture 14 to the detector enables TEM analysis of the nanotube in situ, i.e., at its synthesized, intended location on the substrate. It is generally recognized that nm-scale TEM resolution is required to enable sufficient precision in nanotube analysis. The substrate aperture configuration provided by the invention enables such TEM resolution with a substrate arrangement that is easily positioned for analysis without destruction of a nanotube under investigation.

Figure 4A:
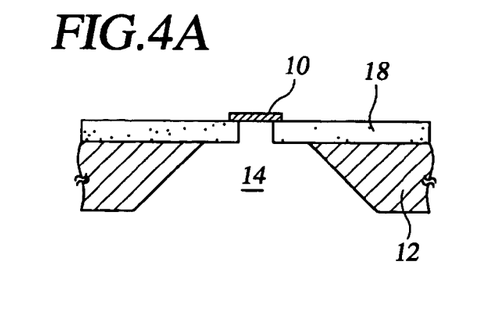
FIGS. 4A-4B are schematic cross-sectional and planar views, respectively, of a carbon nanotube provided in accordance with the invention suspended over an aperture in a membrane.
Figure 4B:
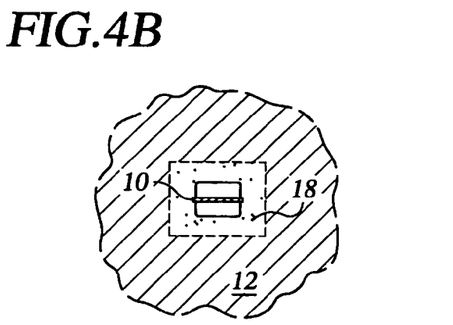

The invention contemplates a wide range of alternative structures in which an aperture can be provided for enabling a suspended nanotube configuration. For example, referring to FIGS. 4A-4B, there can be provided an aperture 14 in a membrane 18 that is disposed on a surface of a substrate 12. The nanotube 10 is provided across the aperture in the membrane. The cross sectional view of FIG. 4A is not shown to scale for clarity; the membrane thickness can be of a selected suitable thickness, and the substrate need not be of a specific thickness.

Figure 5A:
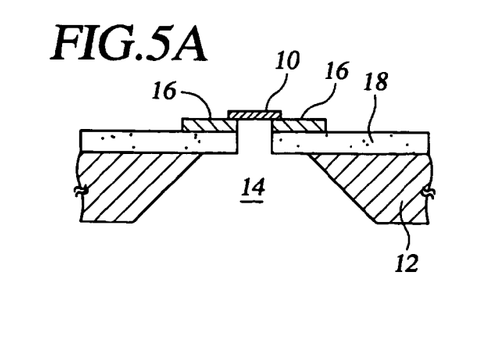
FIGS. 5A-5B are schematic cross-sectional and planar views, respectively, of a carbon nanotube provided in accordance with the invention suspended over an aperture in a membrane and connecting two electrically conducting contact pads.
Figure 5B:
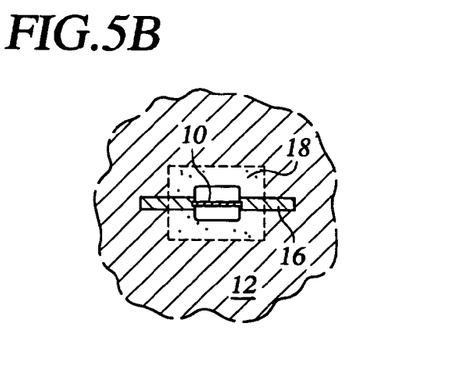

Referring also to FIGS. 5A-5B, as in the substrate configuration of FIGS. 2A-2B, there can here be provided electrically conductive contact pads or strips 16 at peripheral locations around the aperture 14 in the membrane 18. The suspended nanotube 10 then can be configured to bridge the contact pads across the aperture.

It is to be recognized in accordance with the invention that the example nanotube configurations described above can be adapted as needed for a given application. For example, the substrate can be provided as any suitable material and can consist of multiple composite material layers. Similarly, a substrate surface membrane can be provided as any suitable material and can consist of multiple membrane material layers as-required for a given application.

The electrically conducting contact pads or strips can be provided of any suitable conducting material that is compatible with the nanotube synthesis process, as described below, to enable formation of a nanotube that is disposed on top of the pad, i.e., that contacts the top surface of the contact pad or strip. There is no required pad shape or pattern, but preferably an edge of each contact pad coincides with the periphery of the aperture across which a nanotube is to be synthesized. The contact pads can make electrical connection to circuitry that is provided on the substrate or to locations for connection with external circuitry. Indeed, the contact pads are shown in the figures as isolated structures only for clarity; it is understood in accordance with the invention that the contact pads can be provided in a range of configurations to make connection to other circuits and/or devices.

Figure 6:
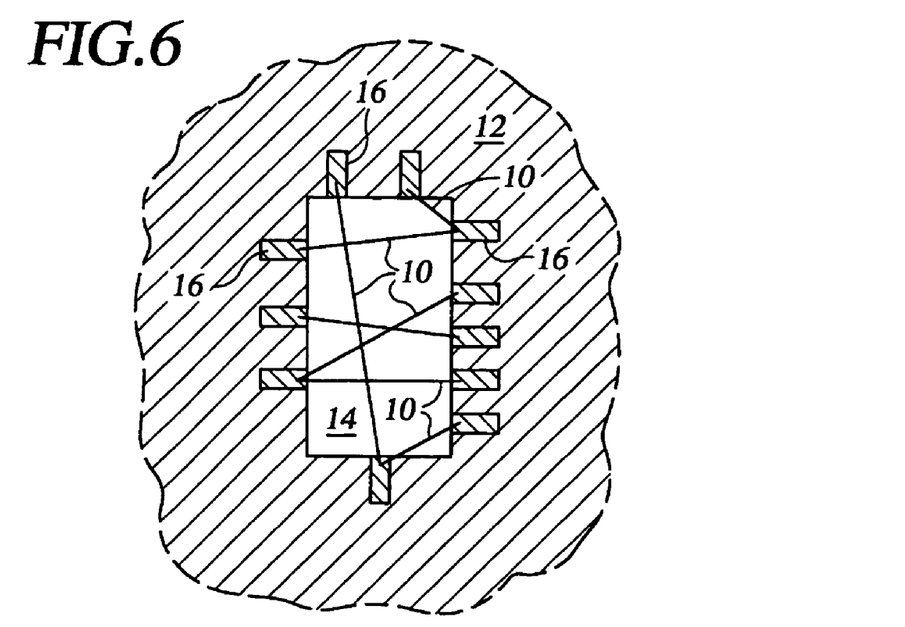
FIG. 6 is a schematic planar view of multiple carbon nanotubes provided in accordance with the invention suspended over an aperture and connected multiple electrically conducting contact pads.

FIGS. 1A-4B illustrate a single nanotube for clarity, but in accordance with the invention, multiple nanotubes can be provided across a single aperture and between multiple contact pads. Referring to FIG. 6, an example configuration of such is shown, with several nanotubes 10 spanning an aperture 14 in a substrate 12. In fact, arrays of nanotubes and/or bundles of nanotubes can be provided across an aperture between multiple pairs of contact pads, and can make contact between several pads. As shown in the figure, contact pads can be located at various points around the aperture periphery, with nanotubes connecting a variety of the pads. As explained in detail below, during the nanotube growth process, electric fields can be applied selectively between particular contact pads to direct the growth of nanotubes between designated contact pads.

The nanotube configurations of FIGS. 1A-2B and FIGS. 4A-5B can be fabricated by any suitable synthesis process that accommodates production of an aperture in a structure that is to support the nanotubes and preferably in addition to support electrical contact pads to which the nanotubes are connected. The invention provides a process sequence that can be particularly advantageous for controllably producing single-walled nanotubes that span an aperture in a support structure. While this example process described below can be preferred for many applications, it is to be recognized that other fabrication processes and nanotube synthesis techniques can also be employed.

Figure 7A:
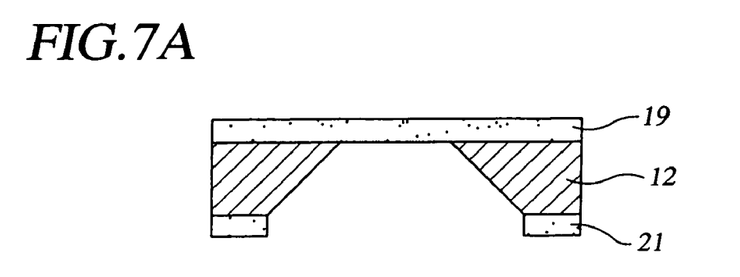
FIGS. 7A-7D are schematic cross-sectional views of a microfabrication process provided by the invention for producing the carbon nanotube configuration of FIGS. 5A-5B.

Referring to FIG. 7A, in an example fabrication process, there is provided a substrate 12 of a selected material, e.g., silicon, alumina, sapphire, or other selected material. The selected substrate material preferably is not deleteriously affected by the nanotube synthesis temperature, and preferably does not diffuse into layers that may be applied to the substrate. If a membrane is to be fabricated on the substrate, then a membrane layer 19 is formed, on the front surface of the substrate, and e.g., a corresponding layer 21 is also formed on the back substrate surface. For example, given a silicon substrate, a membrane layer of silicon nitride or silicon dioxide, e.g., of about 500 nm in thickness, can be formed on both silicon substrate surfaces in the conventional manner, e.g., by low pressure chemical vapor deposition (LPCVD).

While the figures illustrate formation of a membrane on a substrate, it is to be recognized that such is not required by the invention; a substrate having an aperture formed directly there through can alternatively be employed. No particular substrate configuration is required by the invention; any suitable support structure can be employed as may be suited to a given application.

If a membrane is to be produced, a region of the membrane layer 21 on the back substrate surface is then patterned and etched, e.g., by reactive ion etching, to remove a portion of the membrane layer 21 to expose the substrate surface for production of a suspended membrane at the front surface of the substrate. The substrate is then etched through its thickness to the membrane layer 19 at the front surface of the substrate to produce a free-standing membrane; for many applications, a membrane extent of, e.g., about 100 μm can be suitable. Given a silicon substrate, silicon etch techniques, e.g., anisotropic wet etching by KOH, can be employed in the conventional manner. At the completion of the substrate etch, the configuration of FIG. 7A is produced, and the backside layer 21 can be removed if desired. If a substrate is to be employed without a membrane layer, then the formation of membrane layers 19, 21 is not required, and bulk etching of the substrate is preferably carried out to form a thinned substrate front surface region at the location corresponding to the membrane layer 19.

Figure 7B:
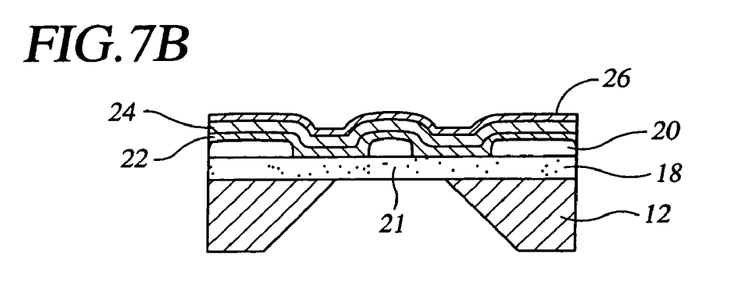

Referring to FIG. 7B, given a free standing membrane 18 produced by the previous steps, then in a next step of the process, one or more metal layers can be deposited for forming electrically conducting contact pads on the substrate or membrane surface, if contact pads are desired for a given application. Patterning of the metal contact pad layer can be carried out using a photoresist lift-off process or other suitable technique. For example, as shown in the figure, a photoresist layer 20 can be deposited and patterned and metal layer or layers 22, 24, blanket-deposited over the patterned photoresist. As shown in FIG. 7B, the patterned photoresist layer 20 preferably defines the contact pad areas and a central area 21 that is between the contact pad locations and is the location at which the aperture is to be formed. For many applications, it can be preferred for the contact pads to extend several microns or less.

In one metal layer deposition process example, a layer of Cr is deposited as a first metal layer 22, of, e.g., about 15-50 nm in thickness, to serve as an adhesion layer, and a metal electrode material layer of Pt of, e.g., about 50 nm in thickness is then deposited as a second metal layer 24. Any suitable metal or composite of metals can be employed, so long as the selected material can withstand a subsequent heat cycle for nanotube synthesis. Conventional metal electroplating processes, or other selected metal deposition process can be employed.

In this example, the metal layers are deposited on a membrane 18. If metal contact pads are to be included, it is preferred in accordance with the invention that the membrane material be electrically insulating such that the metal contact pads are discretely electrically isolated. Similarly, if a substrate surface itself, rather than a membrane, is to be employed for nanotube synthesis, then the substrate surface preferably is electrically insulating. Given a semiconducting substrate of, e.g., silicon, or a membrane material of, e.g., silicon or polysilicon, it can be preferred to provide this condition with an insulating layer, e.g., of silicon dioxide or silicon nitride, on the substrate or membrane surface prior to metal contact pad formation.

Referring to FIG. 7B, for many applications, it can be convenient at this point in the fabrication sequence to also deposit a layer 26 of nanotube synthesis catalyst material on top of the electrode material, prior to lift-off patterning of the electrode material layer. In accordance with the invention, the nanotube catalyst layer can be formed in any convenient manner, of a suitable material. A nanotube catalyst of layer of, e.g., Fe, Co, Ni, or alloys of such are understood to be most effective for many applications.

The invention provides a preferred catalyst deposition process that is understood to enable precise control of catalyst properties, and correspondingly precise control of nanotube growth, such that single-walled nanotubes oriented horizontally, parallel to a support surface, are selectively synthesized. In this process, the catalyst layer is formed by vapor deposition of a solid catalyst material, by sputtering, molecular beam epitaxy, sol gel formation, E-beam evaporation, thermal evaporation, or other selected vapor deposition process. Whatever vapor deposition process is selected, it preferably is controlled to enable very low coverage of the vapor-deposited film, such that no more than several monolayers of the selected catalyst material are deposited on the membrane or support substrate.

In one example vapor deposition process, thermal evaporation of Fe using a tungsten boat spot welded with Fe foil can be carried out under vacuum conditions, e.g., at a pressure of about $10^{-5}$ or $10^{-6}$ Torr, to produce a Fe catalyst layer of selected thickness. Whatever catalyst material and vapor deposition process is employed, it is preferred in accordance with the invention that the resulting catalyst layer thickness be less than about 2 nm, or considered another way, it is preferred that the catalyst layer be characterized by a layer coverage of about $17 \times 10^{15}$ atoms/cm$^2$ or less. It is understood that as the catalyst layer thickness is increased, the diameter of nanotubes that are horizontally synthesized from the catalyst layer correspondingly increases, and above a threshold catalyst layer thickness, multi-walled, rather than single-walled, horizontal nanotubes are formed.

For applications in which single-walled nanotube synthesis is desired, the invention provides the specification of a thin catalyst layer, e.g., of 2 nm in thickness or less, for predictably and reliably forming single-walled nanotubes. If a given application does not absolutely require the production of single-walled nanotubes, then the thickness of the catalyst layer is not critical, but it is to be recognized that above a critical thickness, the catalyst layer will not support synthesis of horizontal nanotubes, and thus, to ensure horizontal nanotube synthesis across an aperture in accordance with the invention, a relatively thin catalyst layer can be preferred.

Referring back to FIG. 7B, in one example fabrication sequence, once a catalyst layer 26 is formed on top of a metal layer or layers 22, 24, then by using lift-off techniques, the patterned photoresist layer 20 is removed, resulting in patterned catalyst/electrode regions. This technique can be particularly advantageous because it enables patterning of both electrode and catalyst layers in a single step. For applications in which it is acceptable for the extent of catalyst regions to coincide with that of electrode contact pads, this process can therefore be preferred.

If for a given application, it is preferred that the catalyst regions do not fully cover the contact pads, then an additional lithographic and etch sequence can be carried out to remove catalyst material from portions of the contact layer. In one example process, the catalyst layer is masked with, e.g., a patterned photoresist layer, exposing regions of the catalyst layer that are to be removed. A dry etch process, e.g., plasma etching, ion beam etching, or other technique, is then employed to remove the unwanted catalyst layer regions. It is recognized that many catalyst layer etch processes may not be significantly selective in etching the catalyst material over the underlying metal electrode material. It therefore can be preferred that the catalyst etch process be controlled as a timed process or with other controls to ensure that the integrity of the metal contact pad material is maintained.

Figure 8A:
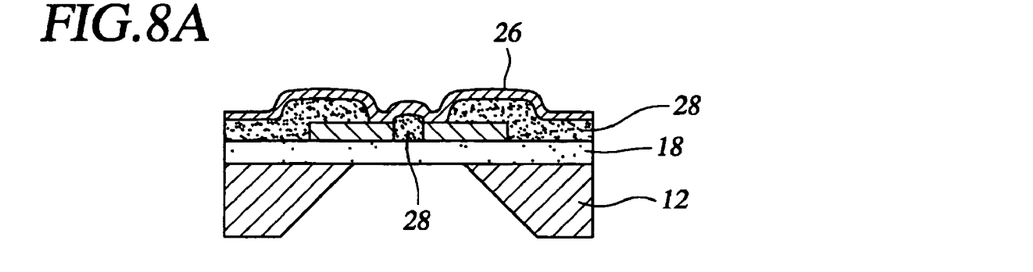
FIGS. 8A-8B are schematic cross-sectional views of microfabrication process steps that can be employed as an alternative to that of FIG. 7B.
Figure 8B:
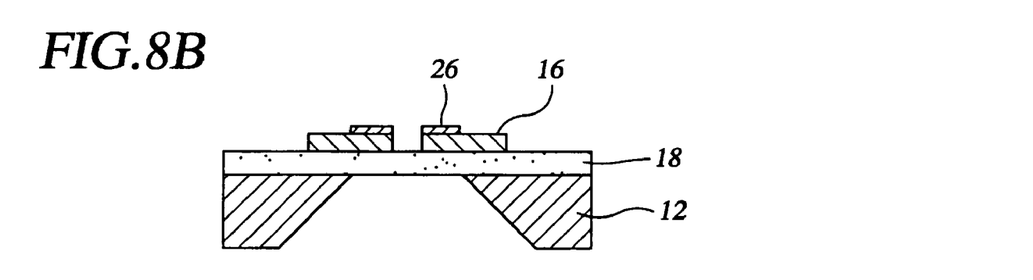

In an alternate process, the catalyst layer can be patterned and etched in a sequence of steps separate from that employed for the electrode layer. For example, the electrode layer can be patterned by, e.g., a lift-off process as just described, and then the catalyst layer deposited and patterned by a second separate lift-off process. Referring to FIG. 8A, in this scenario, a photoresist layer 28 is formed over the produced contact pads 16 and the designated location for the aperture and patterned to expose regions of the contact pads at which it is desired to provide a region of nanotube catalyst layer. The catalyst layer 26 is then blanket-deposited, preferably by a selected vapor deposition process like that described above. Referring to FIG. 8B, lift-off of the photoresist layer 28 is then carried out to remove portions of the catalyst layer, resulting in a patterned catalyst region atop the contact pads.

It is not required that the catalyst layer be patterned by a lift-off process; instead, the catalyst layer can be blanket-deposited on the contact pads and then etched, e.g., by lithographic patterning of a photoresist layer applied on top of the catalyst layer and patterned to define distinct catalyst islands. Etching of the catalyst regions exposed through the photoresist pattern can then be carried out employing a suitable etch process. This approach, like the catalyst lift-off approach, has the advantage of enabling precise formation of catalyst islands that do not necessarily extend across an entire electrode contact pad, and therefore that more precisely define the location of nanotube synthesis.

Whatever process sequence is employed to produce contact pads and catalyst regions, it can be preferred in accordance with the invention to define their locations as shown in the example of FIGS. 7 and 8, with the membrane or substrate location at which an aperture is to be formed left uncovered by metal and catalyst materials. This scenario enables the use of an aligned mask to etch an aperture between the contact pads right at the edge of the contact pads and catalyst regions, resulting in the structure of FIG. 7C.

Figure 7C:
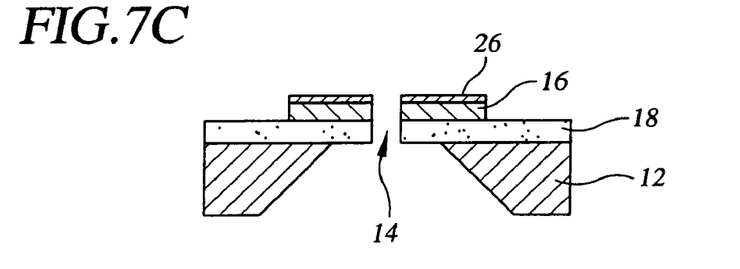
Figure 9:
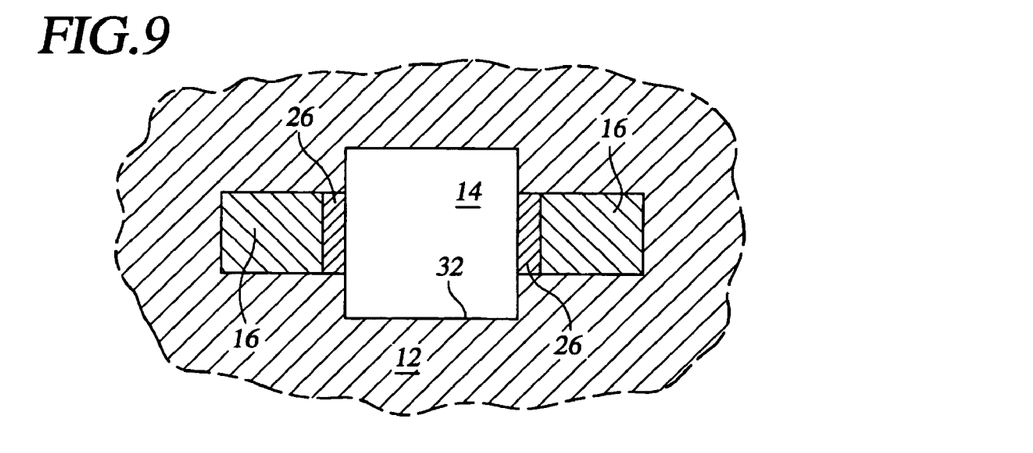
FIG. 9 is a schematic planar view of an example nanotube catalyst and contact pad configuration provided by the invention.

Alternatively, the contact pad and catalyst regions can be extended across an intended aperture location, such that production of an aperture through the contact pad and catalyst layers enables self alignment of the contact pads and catalyst regions with edges of the aperture. This results in production of two contact pads that are separated by the aperture, as shown in FIG. 7C. FIG. 9 provides a planar view of one example of such a preferred structure, with two contact pads 16 separated by the aperture 14, with the contact pads abutting the edge 32 of the aperture. This illustrated structure can be formed in any suitable manner, and the invention is not limited to a particular technique for producing this structure. Any convenient process that enables alignment of catalyst regions and contact pads with edges of an aperture can be employed.

Also shown in the configuration of FIG. 9 is a condition in which catalyst layer regions 26 abut the aperture edge 32 and do not extend across the expanse of the contact pads. Such a condition can be produced by the various catalyst layer etch sequences just described. Whatever catalyst pattern is desired, it is preferably produced in accordance with the invention by a lithographic process that enables precise definition of the location and extent of catalyst regions. This lithographic catalyst definition, in combination with vapor deposition of a thin catalyst layer, enables precise nanotube synthesis.

Figure 10:
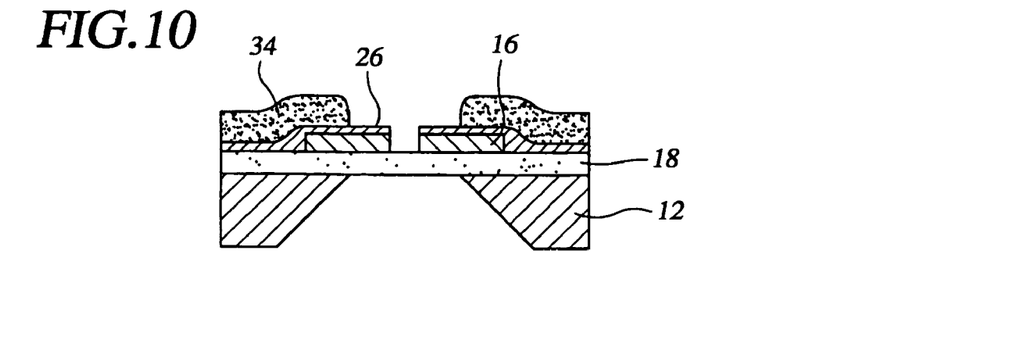
FIG. 10 is a schematic cross-sectional view of a nanotube catalyst layer configuration provided by the invention.

Referring also to FIG. 10, this preferable lithographic definition of the catalyst regions does not require etching of the catalyst layer. For example, as shown in the figure, a blanket deposition of catalyst layer 26 can be carried out in the manner described above, and then a capping layer 34 can be deposited and patterned. The capping layer pattern exposes regions of the catalyst layer at which it is desired to synthesize nanotubes, with the remainder of the catalyst layer being covered to inhibit nanotube synthesis. With this configuration, the catalyst layer is not itself etched, but through lithography the precise location of catalyst exposure for nanotube synthesis is accomplished.

Turning back to FIG. 7C, once the catalyst layer regions 26 are formed at selected sites on contact pads 16, an aperture is formed through the membrane 18 or other support structure on which nanotubes are to be provided. In one example process, the membrane or substrate is lithographically masked and then etched with a suitable etchant, e.g., a plasma etch, with the adjacent contact pad and catalyst layer regions masked from the aperture etch. Lithographic patterning of each layer to be etched can be carried out in sequence, with one or more layers etched together as possible by a given etch recipe. Alternatively, focused ion beam milling of the catalyst, contact pad, and membrane materials can be carried out directly, in the manner described previously, to enable self alignment of the various layers with the aperture. The resulting structure, as in FIG. 7C, provides an aperture 14 with contact pads 16 and catalyst regions 26 in alignment. A plurality of apertures can be formed in a given substrate, membrane, or other support structure, in arrays or other configuration suitable for a given application.

Figure 7D:
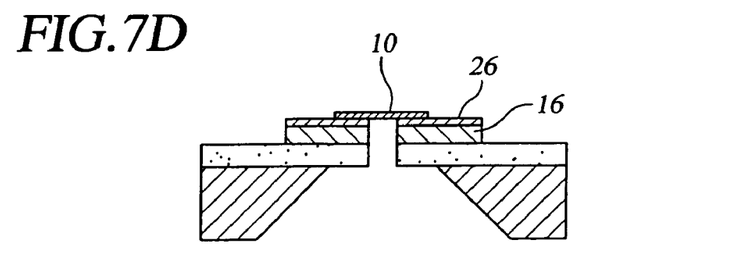

Once selected apertures are produced, nanotube synthesis can be carried out on the substrate or membrane. Referring to FIG. 7D, the nanotube synthesis is particularly carried out to produce one or more nanotubes 10 bridging each aperture to connect to edges of the aperture or to contact pads 16 in the manner shown. In one example synthesis process, nanotube growth is carried out in a suitable system, e.g., a furnace system. A substrate on which nanotube growth is desired is loaded into the furnace system and the temperature of the system is raised to the desired growth temperature, which can be, e.g., between about 600° C.-1500° C., and preferably is about 900° C. During the temperature ramp, it can be preferred to provide a flow of an inert gas, e.g., argon, to suppress oxidation of the contact pad material, catalyst material, membrane and/or substrate material, and other materials included in the configuration.

When the desired synthesis temperature is reached, the gas flow is switched to a hydrocarbon gas, e.g., a methane gas flow. The methane gas flow is preferably maintained at between about 100 sccm and about 400 sccm, with a flow rate of about 200 sccm preferred. With this relatively low gas flow, it is found in accordance with the invention that amorphous carbon formation on and around synthesized nanotubes and the substrate area is substantially inhibited. As a result, in accordance with the invention there is no need for inclusion of hydrogen or other gas flow in addition to the methane to inhibit amorphous carbon formation. The suppression of amorphous carbon formation during the nanotube synthesis process also eliminates the need for post-growth purification processes; as-grown nanotubes can be directly employed. It is understood in accordance with the invention that the influence of gas flow direction on the orientation of nanotubes as they are synthesized is negligible, and therefore that no particular orientation of substrates with respect to gas flow is required.

The methane gas flow exposure of the catalyst material can be carried out for any duration required for a given application to produce nanotubes of selected diameter and quantity. For many applications, it can be preferred to carry out the methane gas flow exposure for 10 minutes or less to repeatably synthesize single-walled nanotubes at significant yields and good quality. If such is not a requirement, the gas flow can be continued for any selected duration depending on the desired yield of nanotubes. It is found, however, in accordance with the invention, that minimization of nanotube synthesis time can be preferred in that such reduces the production of amorphous carbon on the nanotubes and surrounding structures.

It is understood in accordance with the invention that the low-coverage catalyst layer prescribed by the invention produces in the high-temperature synthesis process catalytic nanoparticles at which nanotube growth is initiated. More specifically, nanoscale catalyst particles nucleate from the catalyst layer regions during the high-temperature synthesis process. These nanoscale particles are sites at which single-walled nanotube growth is initiated. Thus, single-walled nanotube synthesis can be automatically and selectively enforced by the use of the low-coverage catalyst layer of the invention, with nanometer-scale synthesis sites produced during the high-temperature synthesis step. If desired, prior to the methane gas synthesis flow step, a first high-temperature annealing step can be included, preferably in argon or other inert gas flow, to pre-nucleate the catalyst regions. Such an anneal step can be carried out, e.g., at the same temperature to be employed for the synthesis step, or at another selected temperature, for a reasonable time.

During the methane gas flow, an electric field can be applied across an aperture to aid in directional synthesis of nanotubes across the aperture. For example, a voltage can be applied between contact pads at edges of the aperture or a contact pads provided a distance from the aperture specifically for electric field application, as-desired. The selected voltage bias preferably takes into account the distance between contact pads for producing a desired electric field. A bias of, e.g., 0.5 V/μm of distance between contact pads is sufficient for inducing directionality in the nanotube synthesis, whereby the nanotubes align with the field direction, due to a torque on an induced dipole moment of a nanotube by the applied electric field. As described previously, an electric field can be applied to enable nanotube synthesis in one or more selected directions across an aperture.

EXAMPLE

A silicon nitride membrane having electrically conducting contact pads and a nanotube synthesis catalyst region adjacent to an aperture was fabricated in the manner described above and illustrated in FIGS. 7A-7D. Employing a single lift-off process, two 2 μm-wide contact pads formed of a 50 nm-thick layer of Cr and a 50 nm-thick layer of Pt were formed, with an Fe catalyst layer of $5 \times 10^{15}$ atoms/cm$^2$ coverage thermally evaporated atop the contact pad layer. A focused ion beam milling process was employed to mill an aperture through the catalyst layer, the contact pad layers, and the silicon nitride membrane. Nanotube synthesis was then carried out in a 200 sccm flow of methane gas of at a temperature of 900° C. for—less than 5 minutes for various samples.

With these synthesis conditions, it was found that one or a few single-walled nanotubes were formed suspended across each aperture between electrodes and the overlying catalyst layer, as determined by TEM carried out directly on the as-grown nanotubes at their synthesized locations. Electrical measurements were made on the as-grown samples, without any post-growth electrical contacting process. It was found that amorphous carbon made no contribution to the measured electrical properties of the nanotube structures.

Figure 11:
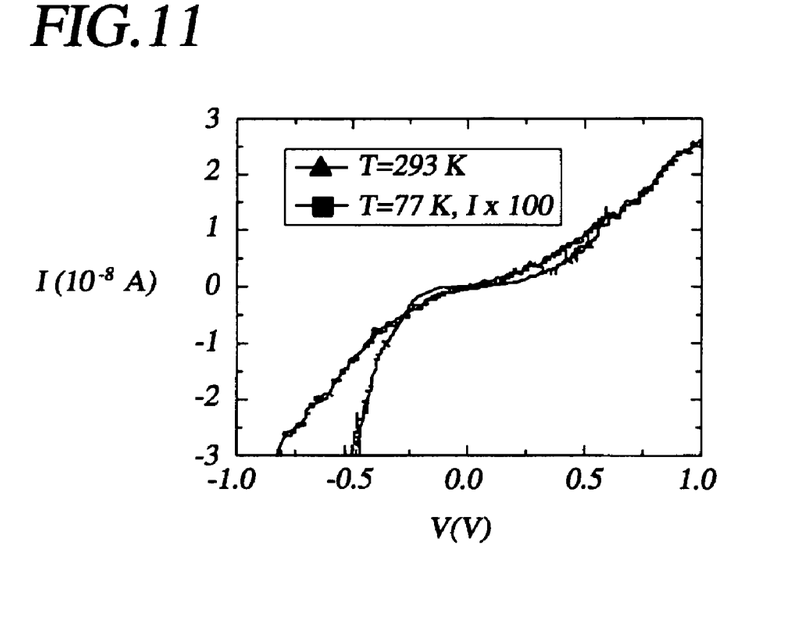
FIG. 11 is a plot of experimentally measured current as a function of voltage for an experimentally fabricated semiconducting single-walled carbon nanotube produced in accordance with the invention.

FIG. 11 is a plot of current as a function of applied voltage between two contact pads connected by a single-walled nanotube bridging an aperture between the contact pads. In this sample, the single-walled nanotube is semiconducting. At room temperature, the low-bias differential resistance was ~100 MΩ, and bandgap-related nonlinearity was already visible. An asymmetry appears, which is most likely due to a contact difference between the two ends of the nanotube.

Figure 12:
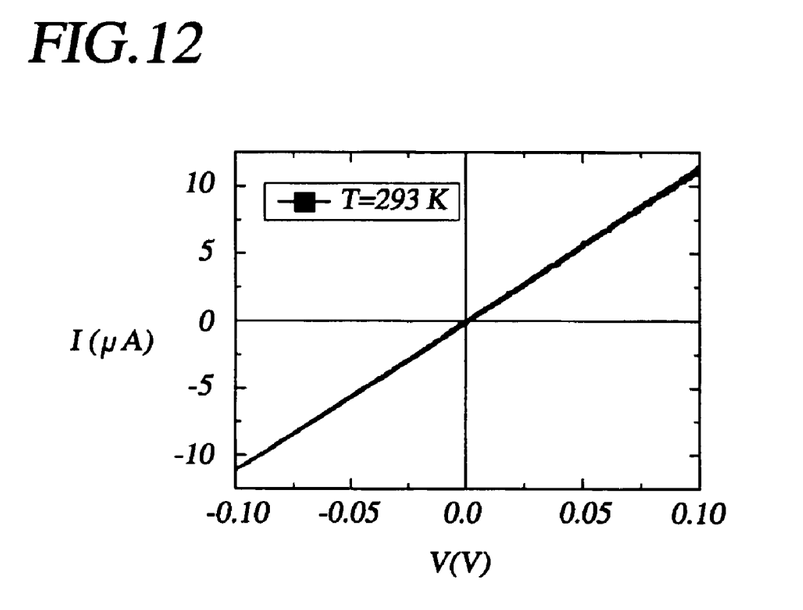
FIG. 12 is a plot of experimentally measured current as a function of voltage for an experimentally fabricated metallic single-walled carbon nanotube produced in accordance with the invention.

When the temperature was reduced to 77 K, a gap is clearly observed in the I-V curve. Assuming two Schottky barriers in series at the two contacts between the semiconducting nanotube and the electrodes, the energy gap of the nanotube is determined to be about 0.25 eV, which is half the plateau of the I-V curve. Gap values of up to about 0.9 eV were determined for other semiconducting single-walled nanotubes in other samples, which corresponds to a tube diameter of about 0.9 nm. FIG. 12 is a plot of current as a function of applied voltage, at room temperature, between two contact pads connected by a metallic single-walled nanotube bridging an aperture between the contact pads. The linear resistance for this metallic sample was determined to be ~10 K$\Omega$.

The controlled growth of single-walled nanotubes across apertures and between electrical contact pads as enabled by the invention addresses a wide range of applications, including sensing, mechanical and electronic applications. For example, a nanotube suspended across an aperture can be employed as a chemical or other sensor in which a species under investigation is passed through an aperture across a nanotube. In addition, crossed nanotubes bridged by appropriate molecules can provide true single molecule negative differential resistance (NDR) device capabilities.

The nanotube synthesis process of the invention is highly compatible with, and adaptable to, standard semiconductor microfabrication techniques, including lithographic patterning techniques. It therefore enables the adoption of carbon nanotubes in large scale applications that require integration with silicon-based design and microfabrication processes. Further, because only standard process techniques are employed, no unconventional equipment or process control is required.

From the foregoing, it is apparent that the nanotube synthesis of the invention provides an elegant approach for producing single-walled nanotubes in a desired configuration that accommodates in situ TEM analysis of a synthesized structure. It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:

1. A carbon nanotube device comprising:
   a substrate including an aperture extending from a front surface to a back surface of the substrate, with the aperture open only at the front surface and the back surface;
   at least one pair of electrically conducting contact pads disposed on a selected one of the front and back substrate surfaces with the conducting contact pads in a given pair of pads being separated from each other by the aperture;
   a carbon nanotube catalyst region disposed on top of each of the contact pads in alignment with an edge of the aperture and exposed at the selected substrate surface; and
   at least one carbon nanotube extending across the aperture and accessible through the aperture from both the front surface and the back surface of the substrate, each end of the carbon nanotube contacting an exposed catalyst region on a contact pad at the selected substrate surface.

2. The device of claim 1 wherein the carbon nanotube comprises a single-walled carbon nanotube.

3. The device of claim 1 wherein the carbon nanotube comprises a multi-walled carbon nanotube.

4. The device of claim 1 wherein the carbon nanotube comprises a semiconducting carbon nanotube.

5. The device of claim 1 wherein the carbon nanotube comprises a metallic carbon nanotube.

6. The device of claim 1 wherein the at least one carbon nanotube comprises a plurality of carbon nanotubes.

7. The device of claim 1 wherein the substrate comprises a semiconducting substrate.

8. The device of claim 1 wherein the substrate comprises a membrane having an aperture there-through and on a top surface of which are disposed the contact pads and the catalyst regions.

9. The device of claim 8 wherein the membrane comprises a silicon nitride membrane.

10. The device of claim 8 wherein the membrane comprises a silicon dioxide membrane.

11. The device of claim 1 wherein the substrate is aligned between a source of electrons and an electron detector for nanometer-scale transmission electron microscopy of the carbon nanotube.

12. The device of claim 1 wherein the at least one pair of electrically conducting contact pads comprises a plurality of pairs of contact pads disposed at locations around the aperture.

13. The device of claim 1 wherein the catalyst regions are less than about 2 nm in thickness.

14. The device of claim 1 wherein the catalyst regions each cover a portion of a contact pad.

15. The device of claim 1 wherein the catalyst regions each cover substantially an entire contact pad.

16. The device of claim 1 wherein an edge of each contact pad is at a periphery of the aperture.

17. The device of claim 1 wherein the contact pads make electrical connection to circuitry provided on the selected substrate surface with the contact pads.

18. The device of claim 1 wherein the contact pads make electrical connection to at least one device provided on the selected substrate surface with the contact pads.

19. The device of claim 1 wherein the substrate comprises a silicon substrate.

20. The device of claim 1 further comprising a free-standing membrane having an aperture there-through and supported at membrane edges by the substrate, the membrane providing the selected surface on which are disposed the contact pads and the catalyst regions.

21. The device of claim 1 wherein the contact pads each comprise a metal including at least one material selected from the group consisting of Pt and Cr.

22. The device of claim 1 wherein the catalyst regions each comprise a material selected from the group consisting of Fe, Co, and Ni.

23. The device of claim 1 wherein the catalyst regions are each characterized by a layer coverage of no greater than about $17 \times 10^{15}$ atoms/cm$^2$.

* * * * *

UNITED STATES PATENT AND TRADEMARK OFFICE
CERTIFICATE OF CORRECTION

Page 1 of 1

PATENT NO. : 7,466,069 B2
APPLICATION NO. : 10/696462
DATED : December 16, 2008
INVENTOR(S) : Golovchenko et al.

It is certified that error appears in the above-identified patent and that said Letters Patent is hereby corrected as shown below:

Title Page, Item (75) Inventor is corrected to read:
-- Jene A. Golovchenko, Lexington (MA);
Haibing Peng, Cambridge (MA);
Daniel Branton, Lexington (MA) --.

Signed and Sealed this
Sixth Day of October, 2015

Michelle K. Lee
*Director of the United States Patent and Trademark Office*